(12) United States Patent
Chen et al.

(10) Patent No.: US 8,173,516 B2
(45) Date of Patent: May 8, 2012

(54) METHOD OF FORMING SHALLOW TRENCH ISOLATION STRUCTURE

(75) Inventors: Neng-Kuo Chen, Sinshih Township (TW); Kuo-Hwa Tzeng, Taipei (TW); Cheng-Yuan Tsai, Chu-Pei (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 44 days.

(21) Appl. No.: 12/703,979

(22) Filed: Feb. 11, 2010

(65) Prior Publication Data

US 2011/0195559 A1 Aug. 11, 2011

(51) Int. Cl.
*H01L 21/76* (2006.01)
(52) U.S. Cl. ........ 438/435; 438/221; 438/296; 438/424; 257/510
(58) Field of Classification Search ................. 257/316, 257/410, 411, 506, 510; 438/285, 296, 424, 438/435; 427/248, 534
See application file for complete search history.

(56) References Cited

U.S. PATENT DOCUMENTS

| | | | | |
|---|---|---|---|---|
| 5,763,315 A | * | 6/1998 | Benedict et al. | 438/424 |
| 5,811,347 A | * | 9/1998 | Gardner et al. | 438/435 |
| 7,939,422 B2 | * | 5/2011 | Ingle et al. | 438/435 |
| 2004/0070046 A1 | * | 4/2004 | Niimi | 257/510 |
| 2005/0260347 A1 | * | 11/2005 | Narwankar et al. | 427/248.1 |
| 2006/0228899 A1 | * | 10/2006 | Nansei et al. | 438/769 |
| 2010/0090294 A1 | * | 4/2010 | Narwankar et al. | 257/411 |
| 2010/0164051 A1 | * | 7/2010 | Chae et al. | 257/499 |

* cited by examiner

*Primary Examiner* — Victor A Mandala
*Assistant Examiner* — Errol Fernandes
(74) *Attorney, Agent, or Firm* — Lowe Hauptman Ham & Berner, LLP

(57) ABSTRACT

An embodiment of the disclosure includes a method of forming a shallow trench isolation structure. A substrate is provided. The substrate includes a top surface. A trench is formed extending from the top surface into the substrate. The trench has sidewalls and a bottom surface. A liner oxide layer is formed on the sidewalls and the bottom surface. The liner oxide layer is treated in a plasma environment comprises at least one of $NF_3$, $F_2$, and $BF_2$. The trench is filled with a dielectric layer.

11 Claims, 3 Drawing Sheets

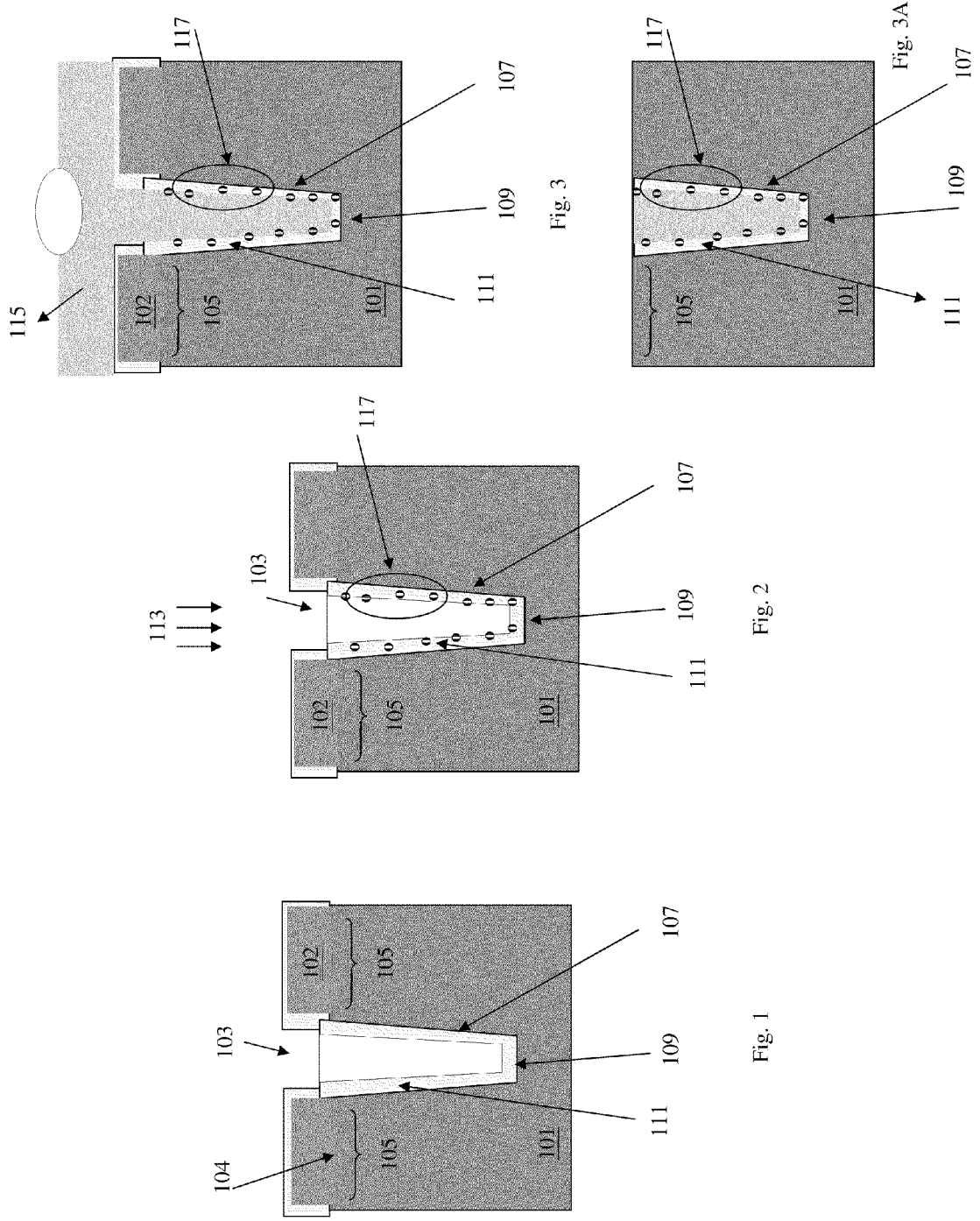

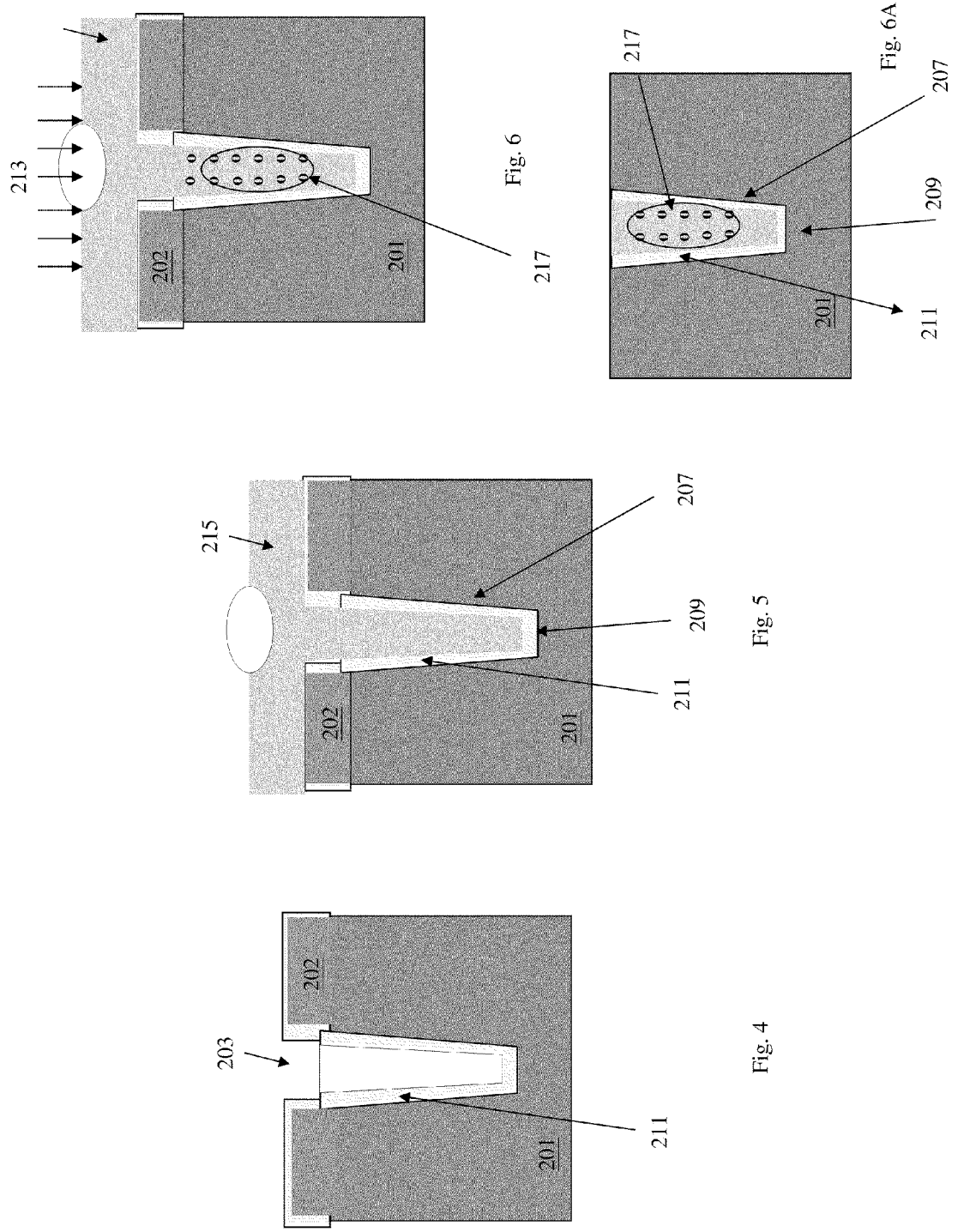

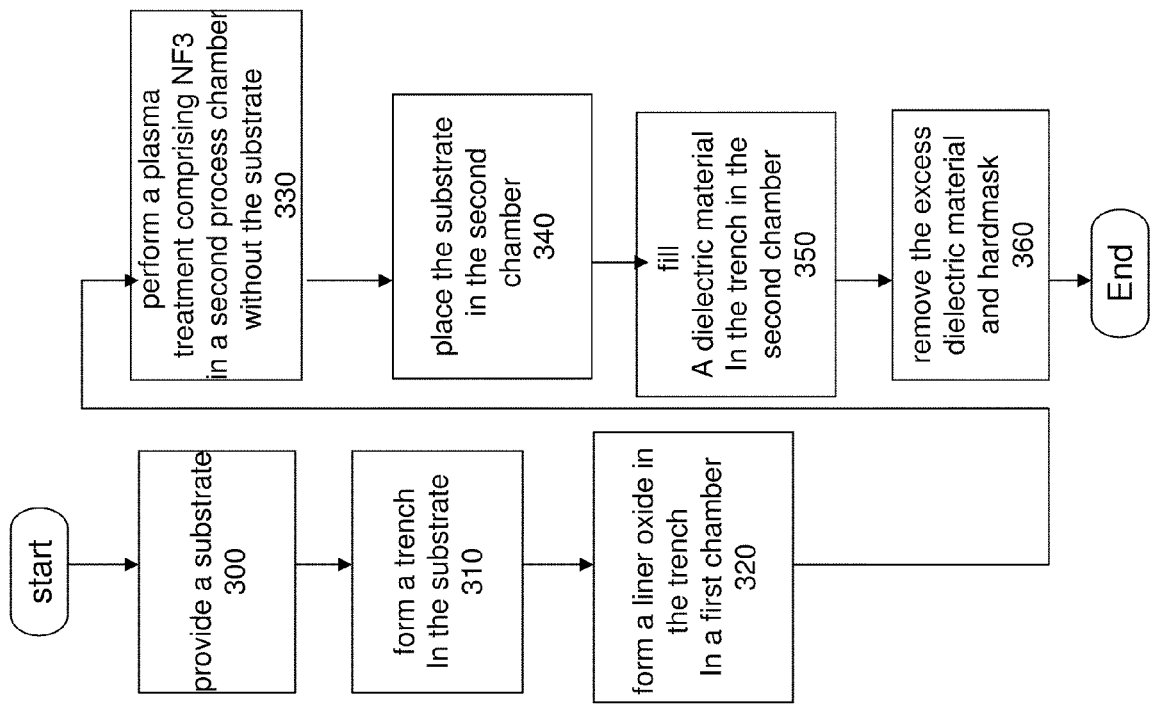

METHOD OF FORMING SHALLOW TRENCH ISOLATION STRUCTURE

TECHNICAL FIELD

The present invention relates generally to systems and methods for manufacturing semiconductor devices, and more particularly to manufacturing methods for a shallow trench isolation.

BACKGROUND

Generally, shallow trench isolations (STIs) are used to separate and isolate active areas on a semiconductor wafer from each other. These STIs have historically been formed by etching trenches, overfilling the trenches with a dielectric such as an oxide, and then removing any excess oxide with a process such as chemical mechanical polishing (CMP) or etching in order to remove the dielectric outside the trenches. This dielectric helps to electrically isolate the active areas from each other.

STIs fabricated by convention methods may not provide adequate isolation. For some products, especially for high voltage devices, the STI isolation breakdown voltage must be higher than 7 volts (V). For example, the breakdown voltage between an Nwell $P^+$ and an adjacent Pwell is around 7V. Many STIs fabricated by conventional methods can not meet the target. The electrical performance of a device with inadequate isolation will be impacted and reduces device yield.

Accordingly, what is needed is a new method of manufacturing an STI to improve breakdown voltage for devices formed on the substrate.

BRIEF DESCRIPTION OF THE DRAWINGS

The disclosure will be described with reference to embodiments thereof as illustrated in the accompanying figures. It should be understood that the drawings are for illustrative purposes and are therefore not drawn to scale.

FIGS. 1 to 3A show a cross-sectional view of a shallow trench isolation structure at various fabrication stages according to a first embodiment.

FIGS. 4 to 6A show a cross-sectional view of a shallow trench isolation structure at various fabrication stages according to a second embodiment.

FIG. 7 is a flow chart of a method for fabricating a shallow trench isolation structure, in accordance with a third embodiment.

DETAILED DESCRIPTION

The making and using of illustrative embodiments are discussed in detail below. It should be appreciated, however, that the disclosure provides many applicable inventive concepts that can be embodied in a wide variety of specific contexts. The specific embodiments discussed are merely illustrative of specific ways to make and use the invention, and do not limit the scope of the invention.

FIGS. 1-3 illustrate the first embodiment of this disclosure. With reference now to FIG. 1, there is shown a substrate 101 covered by a masking layer 102 exposing a trench 103 that separates active areas 105 on a top surface 104 of the substrate 101. The substrate 101 may comprise bulk silicon, doped or undoped, or an active layer of a silicon on insulator (SOI) substrate. Generally, an SOI substrate comprises an active layer of a semiconductor material such as silicon, germanium, silicon germanium, silicon germanium on insulator (SGOI), or combinations thereof. Other substrates that may be used include multi-layered substrates, gradient substrates, or hybrid orientation substrates.

The active areas 105 are preferably electrically conductive regions of the substrate 101 adjacent to the top surface 104 of the substrate 101. The active areas 105 will preferably be used for components of active devices (such as transistors, resistors, etc.) to be formed later. The active areas 105 are preferably formed by the implantation of suitable materials into the crystal silicon substrate. Depending upon the materials chosen, the active areas 105 may comprise either an n-well or a p-well, as preferably determined by the design requirements.

The masking layer 102 is formed over the substrate 101 to protect the active areas 105 while also exposing portions of the substrate 101 to enable the formation of the trench 103. The masking layer 102 may be a hardmask comprising silicon nitride formed through a process such as chemical vapor deposition (CVD), although other materials, such as oxides, oxynitrides, silicon carbide, combinations of these, or the like, and other deposition processes, such as plasma enhanced chemical vapor deposition (PECVD), low pressure chemical vapor deposition (LPCVD), or even silicon oxide formation followed by nitridation, may alternatively be utilized. Once formed, the masking layer 102 is patterned through suitable photolithographic and etching processes to expose those portions of the substrate 101 that will form the trench 103.

As one of skill in the art will recognize, however, the processes and materials described above to form the masking layer 102 are not the only method that may be used to protect the active areas 105 while exposing portions of the substrate 101 for the formation of trench 103. Any suitable process, such as a patterned and developed photoresist, may alternatively be utilized to protect the active areas 105 of the substrate 101 while exposing portions of the substrate 101 to be removed to form the trench 103. All such methods are fully intended to be included in the scope of the present invention.

Once the masking layer 102 has been formed and patterned, the trench 103 is formed so that it extends from the top surface 104 into the substrate 101. The trench 103 comprises sidewalls 107 and a bottom surface 109. The exposed portions of the substrate 101 are removed through a suitable process such as reactive ion etching (RIE) in order to form the trench 103 in the substrate 101, although other suitable processes may alternatively be used.

A liner oxide layer 111 is then formed on the sidewalls 107 and the bottom surface 109 of the trench 103. In an embodiment, the liner oxide layer 111 may be a thermal oxide having a thickness of between about 30 Å to about 200 Å. In other embodiments, the liner oxide layer 111 is formed using in-situ steam generation (ISSG). Alternatively, the liner oxide layer 111 may be formed using a deposition technique that can form a conformal oxide layer, such as the high aspect ratio process (HARP), or the like.

As shown in FIG. 2, the liner oxide layer 111 is then treated in a plasma environment 113 comprising $NF_3$. Other fluorine-containing gases could also be used such as $F_2$, $BF_2$ or combinations thereof. In one embodiment, the first plasma environment 113 comprises a carrier gas such as $H_2$, He, $N_2$, Ne, Ar, Kr, Xe or Rn. The carrier gas helps to better control the plasma density and treatment uniformity. In one embodiment, the flow rates of $NF_3$, $H_2$ and He should be in the range of about 50 standard cubic centimeters per minute (sccm) to about 500 sccm, of about 50 sccm to about 1000 sccm and of about 50 sccm to about 1000 sccm, respectively. An operation power of the first plasma environment is about 2000 W to about 10000 W. It is believed that the treatment of the oxide liner layer 111 in the plasma environment 113 enables fluorine radicals 117 to adhere on the liner oxide layer 111. It is also believed that the fluorine radicals 117 would trap the charges in the source/drain region and well region to prevent the charges to penetrate through the dielectric material 115. Regardless of the mechanism, treating the liner oxide layer in the above described plasma environments increases the breakdown voltage of the STI, enabling the STI to provide improved isolation.

Referring to FIG. 3, the trenches 103 are filled with a dielectric material 115 to form a shallow trench isolation (STI) structure. The dielectric material 115 may comprise silicon oxide, silicon nitride, silicon oxynitride, fluoride-doped silicate glass (FSG), other suitable insulating materials, and/or combinations thereof. The STI structure is formed by overfilling the trenches 103 and the masking layer 102 with the dielectric material 115 and then removing the excess material outside of the trenches 103 and masking layer 102 through a suitable process such as chemical mechanical polishing (CMP), an etch, a combination of these, or the like. The removal process preferably removes any dielectric material 115 that is located over the masking layer 102 as well, so that the removal of the masking layer 102 will expose the active areas 105 to further process steps. FIG. 3A shows a completed STI 116 after the excess dielectric material 115 and masking layer 102 have been removed.

FIGS. 4-6 illustrate a second embodiment. FIG. 4 is a cross-sectional diagram depicting the STI formation process at the same stage as previously described with regards to FIG. 1. Just as in FIG. 1, the structure in FIG. 4 comprises a substrate 201, a liner oxide layer 211, a trench 203 and a mask layer 202. The trench 203 includes sidewalls 207 and a bottom surface 209. A liner oxide layer 211 is formed on the sidewalls 207 and the bottom surface 209.

In the second embodiment, as shown in FIG. 5, a dielectric material 215 is then formed by overfilling the trench 203 and the masking layer 202. The dielectric material 215 may comprise silicon oxide, silicon nitride, silicon oxynitride, fluoride-doped silicate glass (FSG), other suitable insulating materials, and/or combinations thereof. The dielectric layer 215 may be formed by a chemical vapor deposition (CVD) method, such as the HARP process, a high density plasma CVD method, or other suitable method of formation as is known in this art. Compared with the liner oxide layer 111 as depicted in FIG. 3, the liner oxide layer 211 in FIG. 5 is not treated before the dielectric material 215 filled in.

Referring FIG. 6, an ion implantation process 213 is then performed over the dielectric material 215 to form a modified region 217 in the dielectric material 215 within the trench 203. The ion source of the ion implantation process 213 comprises $BF_2$ or $NF_3$. The ion implantation 213 may be performed with a tilt angle from about 0 to about 15 degrees. A range of energy to apply in the ion implantation is between about 5 to 15 Key. A dosage used in the ion implantation is from about $5 \times 10^{13}$ to about $5 \times 10^{15}$ atoms/cm$^3$. By implanting ions with different energy values, different depths of the modified region 217 may be achieved. The above-described ion sources generate fluorine radicals, which penetrate into the dielectric material 215 and stay in the dielectric material 215 to form the modified region 217. It is believed that the fluorine radicals trap the charges in the source/drain region and well region to prevent the charges to penetrate through the dielectric material 215. Regardless of the mechanism, the modified region 217 in the above described ion implantation increases the breakdown voltage of the STI, enabling the STI to provide improved isolation.

Following the ion implantation process, the excess material outside of the trenches 203 and masking layer 202 is removed through a suitable process such as chemical mechanical polishing (CMP), an etch, a combination of these, or the like. The removal process preferably removes any dielectric material 215 that is located over the masking layer 202 as well, so that the removal of the masking layer 202 will expose active areas 205 to further process steps. FIG. 6A shows a completed STI 216 after the excess dielectric material 215 and masking layer 202 have been removed.

Referring to FIG. 7, a flow diagram illustrates the process steps of a third embodiment. The process begins at step 300 by providing a substrate having a top surface. Next, the substrate is patterned to form a trench extending from the top surface into the substrate at step 310. The trench includes sidewalls and a bottom surface. The trench may be patterned using processes known in the art or techniques to be developed in the future. One example is by applying a photoresist layer on the substrate and patterning using a lithography process. Then, etching is performed on the substrate to form a trench.

Once the trench is formed, the process continues to step 320. A liner oxide layer is formed over the substrate lining the sidewalls and the bottom of the trench. The liner oxide layer may be formed by a thermal process such as rapid thermal annealing, ISSG or a deposition process. The liner oxide layer is formed in a first process chamber.

The process continues to step 330 in which a plasma treatment is performed in a second chamber. The plasma treatment is in an environment comprising $NF_3$. In one embodiment, the $NF_3$ has a flow rate of about 500 to about 600 sccm. An operation power is in a range of about 2000 W to about 10000 W. The plasma treatment is performed without the substrate being present in the second chamber in order to condition the interior of the empty second chamber with fluorine radicals.

At step 340, the substrate is transferred out the first chamber through a load lock chamber and then is placed in the second chamber.

At step 350, a dielectric material is filled in the trench in the second chamber. One method of filling is by performing a high density plasma (HDP) chemical vapor deposition (CVD) to fill the trench. The fluorine radicals in the second chamber can diffuse into the liner oxide layer and the dielectric material in the trench. It is believed that the fluorine radicals would trap the charges and enhance the breakdown voltage of two adjacent active devices. Again, regardless of the mechanism, the plasma treatment performed in the second chamber increases the breakdown voltage of the STI, enabling the STI to provide improved isolation The process continues to step 360 to form an STI structure. After the dielectric material is deposited in the trench, the excess dielectric material and hardmask are removed so that the STI structure is formed.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a shallow trench isolation structure, comprising:
   providing a substrate comprising a top surface;
   forming a trench extending from the top surface into the substrate, wherein the trench has sidewalls and a bottom surface;
   forming a liner oxide layer on the sidewalls and the bottom surface;
   causing fluorine radicals to adhere on the liner oxide layer by treating the liner oxide layer in a plasma environment comprising at least one of $NF_3$, $F_2$, and $BF_2$; and
   filling the trench with a dielectric material over the liner oxide layer and the fluorine radicals adhered to the liner oxide layer.

2. The method of claim 1, wherein the plasma environment comprises $NF_3$.

3. The method of claim 2, wherein the $NF_3$ comprises a flow rate, the flow rate is in the range of about 50 standard cubic centimeters per minute (sccm) to about 500 sccm.

4. The method of claim 1, wherein the first plasma environment further comprises a carrier gas selected from a group consisting of $H_2$, He, $N_2$, Ne, Ar, Kr, Xe, and Rn.

5. The method of claim 4, wherein the carrier gas is $H_2$ or Ne.

6. The method of claim 5, wherein the carrier gas is $H_2$, and a flow rate of $H_2$ is the range of about 50 sccm to about 1000 sccm.

7. The method of claim 5, wherein the carrier gas is He, and a flow rate of He is the range of about 50 sccm to about 1000 sccm.

8. The method of claim 1, wherein the dielectric material comprise silicon oxide, silicon nitride, silicon oxynitride, or fluoride-doped silicate glass (FSG).

9. A method of forming a shallow trench isolation structure, comprising:
   providing a substrate comprising a top surface;
   forming a trench extending from the top surface into the substrate, wherein the trench has sidewalls and a bottom surface;
   forming a liner oxide layer on the sidewalls and the bottom surface in a first process chamber;
   performing a plasma treatment in an environment comprising $NF_3$ in a second process chamber without the substrate to generate fluorine radicals in the second process chamber;
   after the plasma treatment, placing the substrate into the second process chamber;
   causing the fluorine radicals in the second process chamber to defuse into the liner oxide layer; and
   filling the trench with a dielectric layer, over the liner oxide layer and the fluorine radicals defused into the liner oxide layer, in the second process chamber after the plasma treatment.

10. The method of claim 9, wherein the $NF_3$ has a flow rate of about 500 to about 600 sccm.

11. The method of claim 9, wherein the plasma treatment has an operation power in a range of about 2000 W to about 10000 W.

* * * * *